(12) United States Patent
Terada (10) Patent No.: US 9,081,160 B2
(45) Date of Patent: Jul. 14, 2015

(54) OPTICAL WAVEGUIDE STRUCTURE AND ELECTRONIC DEVICE

(75) Inventor: Shinsuke Terada, Utsunomiya (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 25 days.

(21) Appl. No.: 13/876,723

(22) PCT Filed: Sep. 28, 2011

(86) PCT No.: PCT/JP2011/072152
§ 371 (c)(1),
(2), (4) Date: Mar. 28, 2013

(87) PCT Pub. No.: WO2012/043609
PCT Pub. Date: Apr. 5, 2013

(65) Prior Publication Data
US 2013/0183014 A1 Jul. 18, 2013

(30) Foreign Application Priority Data

Oct. 1, 2010 (JP) ................. 2010-224414

(51) Int. Cl.
*G02B 6/12* (2006.01)
*G02B 6/42* (2006.01)
*G02B 6/10* (2006.01)
(Continued)

(52) U.S. Cl.
CPC ............. *G02B 6/43* (2013.01); *G02B 6/1228* (2013.01); *G02B 6/4214* (2013.01); *G02B 6/4246* (2013.01); *G03F 7/0005* (2013.01); *H04B 10/40* (2013.01)

(58) Field of Classification Search
CPC ........ G02B 6/02; G02B 6/028; G02B 6/1228; G02B 6/4214; G02B 6/4246; G02B 6/43; H04B 10/40; G03F 7/0005

USPC ............. 385/14, 43, 88–92, 123–124, 31–32, 385/39, 129–132; 430/290
See application file for complete search history.

(56) References Cited

U.S. PATENT DOCUMENTS 7,991,248 B2 * 8/2011 Matsuoka et al. .............. 385/14

FOREIGN PATENT DOCUMENTS

JP 62 284310 10/1987
JP 62 284311 10/1987
(Continued)

OTHER PUBLICATIONS

International Search Report Issued Dec. 27, 2011 in PCT/JP11/072152 Filed Sep. 28, 2011.
(Continued)

*Primary Examiner* — Akm Enayet Ullah
*Assistant Examiner* — Michael Mooney
(74) *Attorney, Agent, or Firm* — Oblon, McClelland, Maier & Neustadt, L.L.P.

(57) ABSTRACT

An optical waveguide structure containing a plurality of core portions for transmitting light (L), in which adjacent core portions are arranged with substantially parallel central axes, and the optical paths of the light (L) that is transmitted through the adjacent core portions are in opposite directions, wherein each core portion has a tapered section in which the area of the cross-section in a direction substantially perpendicular to the central axis decreases gradually in the direction of the optical path of the light (L). A highly reliable electronic device containing the optical waveguide structure is also provided.

20 Claims, 6 Drawing Sheets (51) Int. Cl.
*H04B 10/00* (2013.01)
*G03C 5/00* (2006.01)
*G02B 6/43* (2006.01)
*G02B 6/122* (2006.01)
*H04B 10/40* (2013.01)
*G03F 7/00* (2006.01)

(56) References Cited

FOREIGN PATENT DOCUMENTS

| | | |
|---|---|---|
| JP | 2005 201937 | 7/2005 |
| JP | 2009 139412 | 6/2009 |
| JP | 2010 156869 | 7/2010 |
| TW | 200904928 A | 2/2009 |
| WO | 2010 092801 | 8/2010 |

OTHER PUBLICATIONS

Office Action mailed Dec. 11, 2014, in Taiwanes Patent Application No. 100134725, filed Sep. 27, 2011 (with English Language Search Report).

* cited by examiner

OPTICAL WAVEGUIDE STRUCTURE AND ELECTRONIC DEVICE

TECHNICAL FIELD

The present invention relates to an optical waveguide structure and an electronic device.

Priority is claimed on Japanese Patent Application No. 2010-224414, filed Oct. 1, 2010, the content of which is incorporated herein by reference.

BACKGROUND ART

In recent years, the information wave has lead to increasing use of broadband circuits that are capable of communicating large volumes of information at high speed. Further, the devices used for transmitting information through these broadband circuits include transmission devices such as router devices and WDM (Wavelength Division Multiplexing) devices. A plurality of signal processing boards, which combine an arithmetic element such as an LSI and a storage element such as memory and the like, are installed in these transmission devices and maintain the interconnection between each of the circuits.

Each signal processing board is composed of a circuit in which the arithmetic element and the storage element and the like are connected with electrical wiring, but in recent years, as the amount of information requiring processing has increased, each board has been required to transmit information at an extremely high throughput. However, as the speed of information transmission has increased, problems such as the generation of crosstalk and high-frequency noise, and deterioration in the electrical signals have become apparent. As a result, the electrical wiring has become a bottleneck, and achieving further improvements in the throughput of the signal processing boards is proving difficult. Further, similar problems are also becoming apparent even in super computers and large-scale servers and the like.

On the other hand, optical communication technology that uses optical carrier waves to transport data has also been developed, and in recent years, optical waveguides are becoming increasingly widespread as a means of guiding an optical carrier wave from one point to another point. This optical waveguide has a linear core portion, and a cladding portion that is provided so as to cover the periphery of the core portion. The core portion is formed from a material that is substantially transparent to the light of the optical carrier wave, and the cladding portion is formed from a material having a lower refractive index than the core portion.

In an optical waveguide, the light introduced from one end of the core portion is transmitted (transported) to the other end of the core portion while reflecting off the interface with the cladding portion. A light emitting element such as a semiconductor layer is disposed at the input side of the optical waveguide, and a light receiving element such as a photodiode is disposed at the output side. The light input from the light emitting element is transmitted through the optical waveguide and is received by the light receiving element, and communication is achieved based on the blinking pattern or intensity pattern of the received light.

It is anticipated that by replacing the electrical wiring in a signal processing board with this type of optical waveguide, the aforementioned problems associated with electrical wiring can be resolved, enabling further increases in the throughput of the signal processing board.

For example, Patent Document 1 proposes a signal processing board provided with a plurality of optical waveguides, and a light emitting element and a light receiving element corresponding with each of those optical waveguides. In this signal processing board, the plurality of optical waveguides are formed in the signal processing board by disposing a cladding portion between adjacent core portions so as to contact both core portions.

However, in a signal processing board of this structure, as the packing density is increased and the board is reduced in size, the distance between adjacent core portions narrows, and as a result, crosstalk problems can occur as leaked signals from adjacent core portions enter the core portions.

DOCUMENTS OF RELATED ART

Patent Documents

[Patent Document 1] Japanese Unexamined Patent Application, First Publication No. 2009-139412

DISCLOSURE OF INVENTION

PROBLEMS TO BE SOLVED BY THE INVENTION

Objects of the present invention are to provide a highly reliable optical waveguide structure which suppresses the occurrence of crosstalk between adjacent core portions, and also to provide a highly reliable electronic device that includes the optical waveguide structure.

MEANS TO SOLVE THE PROBLEMS

These objects are achieved using the present invention described in the following aspects (1) to (12).

(1) An optical waveguide structure containing a plurality of core portions for transmitting light, in which adjacent core portions are arranged with substantially parallel central axes, and the optical paths of the light that is transmitted through the adjacent core portions are in opposite directions, wherein each core portion has a tapered section in which the area of the cross-section in a direction substantially perpendicular to the central axis decreases gradually in the direction of the optical path.

(2) The optical waveguide structure according to (1), wherein the end sections at at least one end of the adjacent core portions are mutually offset in the direction of the optical path.

(3) The optical waveguide structure according to (2), wherein the end sections at at least one end of the adjacent core portions are mutually offset in a staggered arrangement in the direction of the optical path.

(4) The optical waveguide structure according to any one of (1) to (3), wherein the core portions do not have an expansion section in which the area of the cross-section in a direction substantially perpendicular to the central axis increases gradually in the direction of the optical path.

(5) The optical waveguide structure according to any one of (1) to (3), wherein the tapered section is formed along substantially the entire length of the core portion.

(6) The optical waveguide structure according to any one of (1) to (3), wherein the tapered section is formed within at least one end section of the core portion.

(7) The optical waveguide structure according to any one of (1) to (6), wherein an optical path modification section that modifies the direction of the optical path is provided at at least one end section of the core portion.

(8) The optical waveguide structure according to (7), wherein an optical element having a light emitting section or a light receiving section is provided in correspondence with the optical path modification section.

(9) The optical waveguide structure according to any one of (1) to (8), wherein the width in plan view of each core portion at the end section on the source side (transmission side) in the direction of the optical path is from 40 to 100 µm.

(10) The optical waveguide structure according to any one of (1) to (9), wherein the width in plan view of each core portion at the end section on the destination side (reception side) in the direction of the optical path is from 10 to 40 µm.

(11) The optical waveguide structure according to any one of (1) to (10), wherein a cladding portion having a lower average refractive index than the average refractive index of the core portions is provided between adjacent core portions so as to contact both core portions.

(12) The optical waveguide structure according to (11), wherein the core portions and the cladding portion are formed by:

irradiating with activating radiation a layer containing a polymer and a monomer having a different refractive index from the polymer, thereby causing a reaction of the monomer to proceed in an irradiated region that has been irradiated with the activating radiation, and causing unreacted monomer to diffuse from a non-irradiated region that has not been irradiated with the activating radiation into the irradiated region, and as a result, generating a difference in refractive index between the irradiated region and the non-irradiated region, wherein one of the irradiated region and the non-irradiated region becomes the core portions, and the other becomes the cladding portion.

(13) The optical waveguide structure according to any one of (1) to (12), wherein the separation distance between adjacent core portions is substantially constant along the entire length of the core portions.

(14) An electronic device, containing the optical waveguide structure according to any one of (1) to (13).

EFFECT OF THE INVENTION

According to the present invention, the occurrence of crosstalk between adjacent core portions can be suppressed. As a result, a highly reliable optical waveguide structure and electronic device can be obtained.

Moreover, miniaturization and increased integration of the optical waveguide can be achieved while maintaining suppression of the occurrence of crosstalk between adjacent core portions.

BEST MODE FOR CARRYING OUT THE INVENTION

The optical waveguide structure and the electronic device of the present invention are described below in detail based on preferred embodiments illustrated in the appended drawings.
<First Embodiment>
First is a description of a first embodiment of the optical waveguide structure of the present invention.

Figure 1:
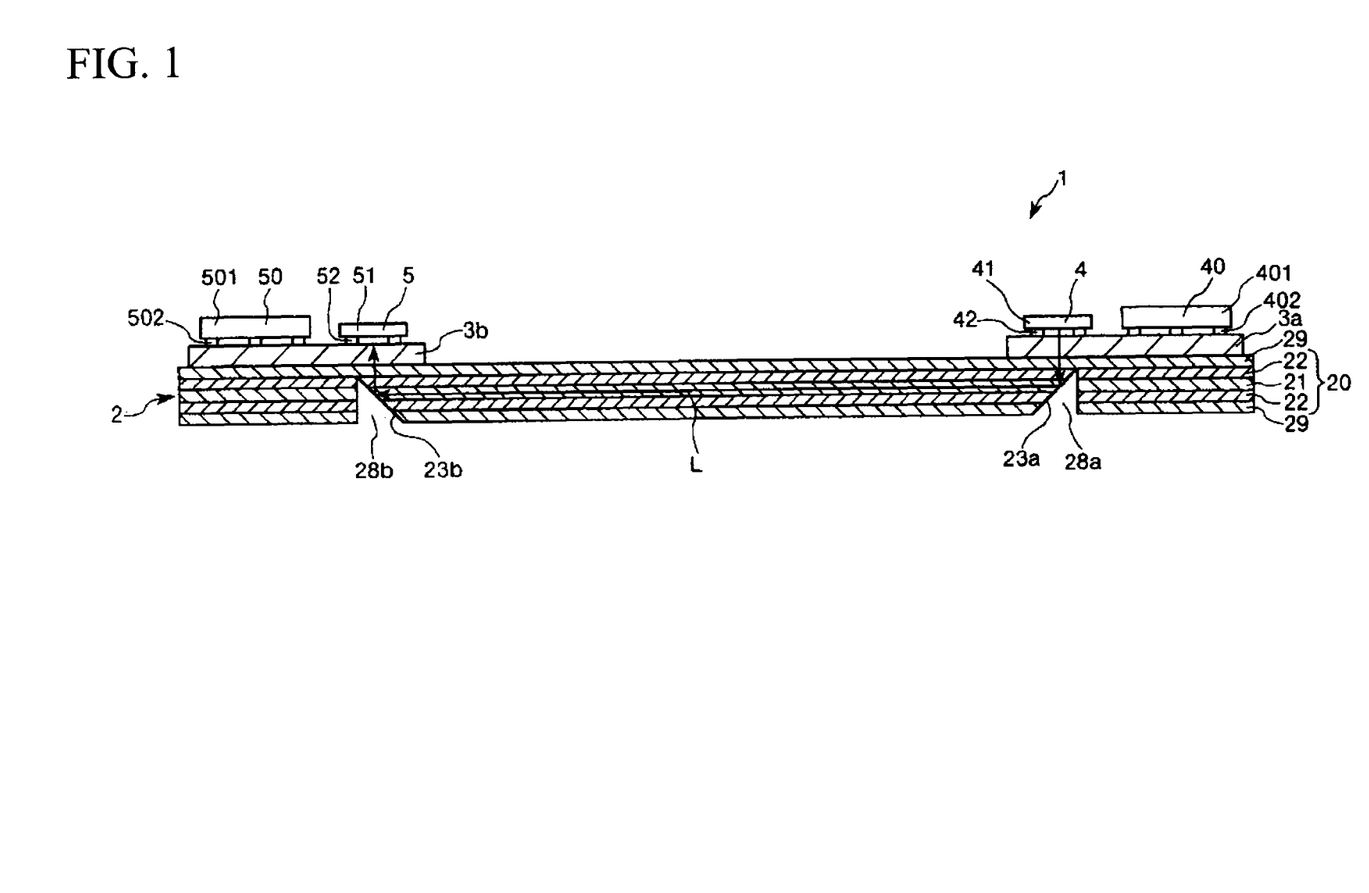
FIG. 1 is a longitudinal sectional view illustrating an outline of a first embodiment of the optical waveguide structure of the present invention.
Figure 2:
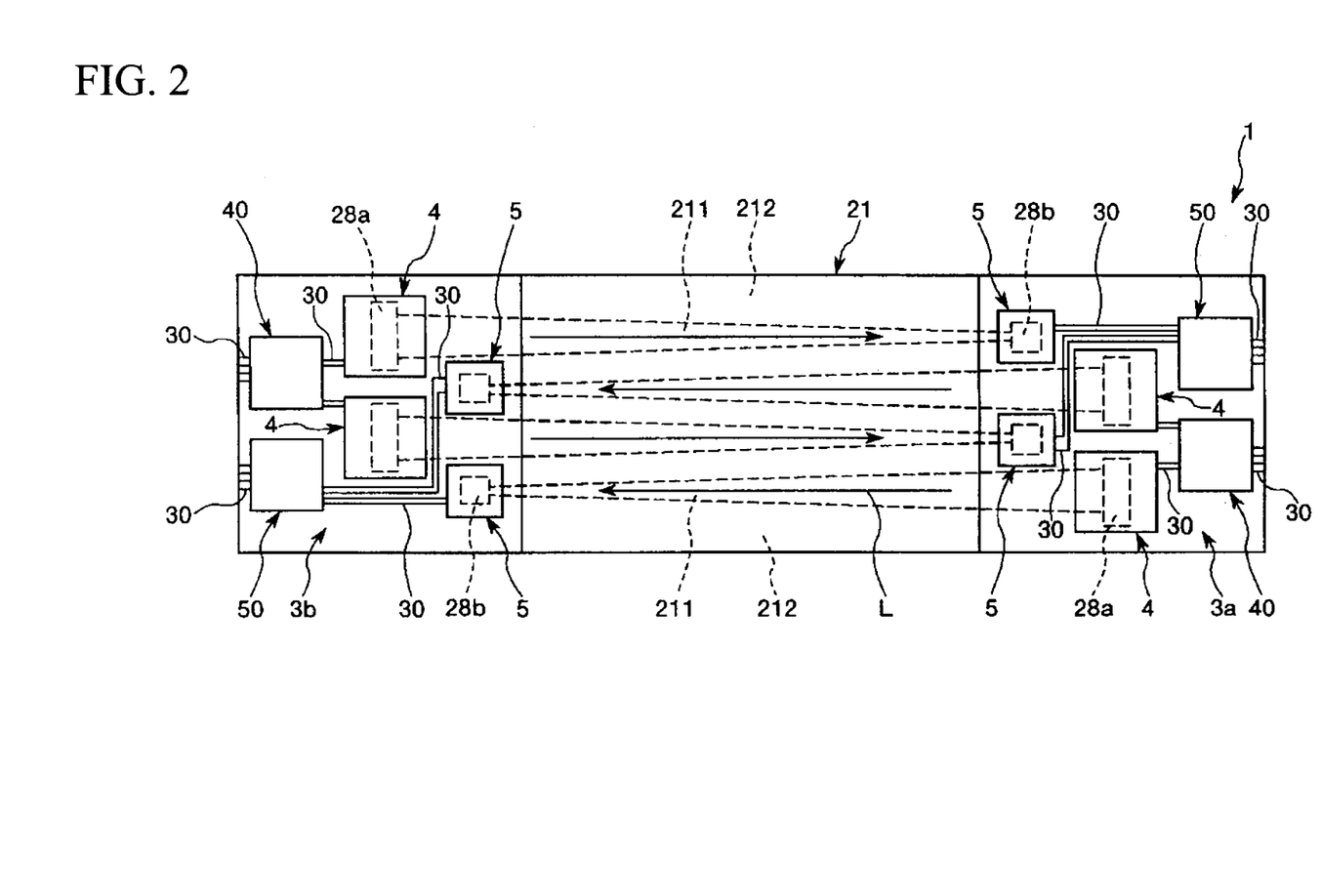
FIG. 2 is a plan view illustrating an outline of the first embodiment of the optical waveguide structure of the present invention.
Figure 3:
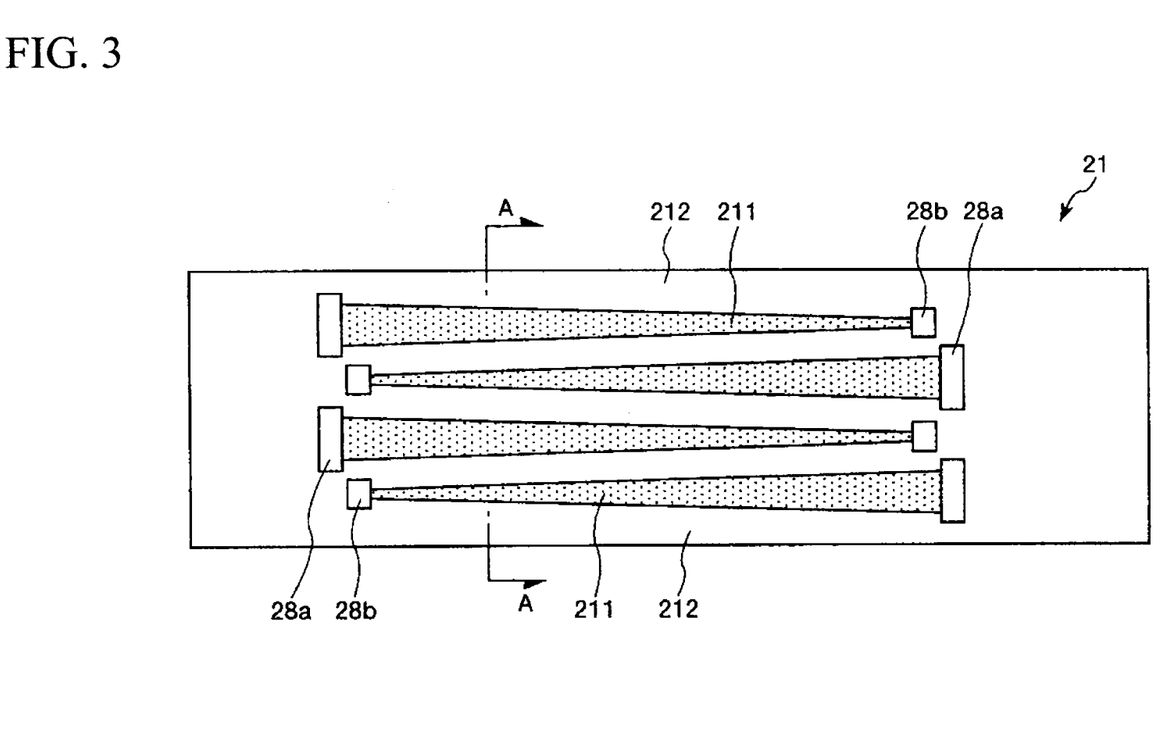
FIG. 3 is a plan view illustrating a core layer of the optical waveguide structure illustrated in FIG. 1 and FIG. 2.
Figure 4:
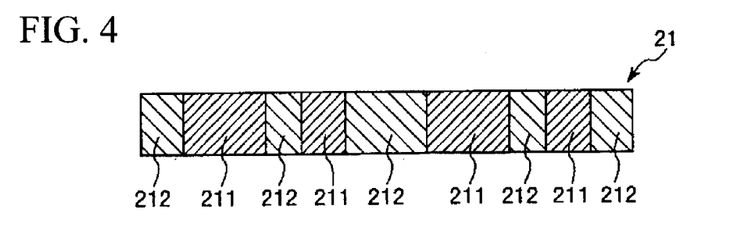
FIG. 4 is a cross-sectional view of the core layer illustrated in FIG. 3 along the line A-A.

FIG. 1 is a longitudinal sectional view illustrating an outline of the first embodiment of the optical waveguide structure of the present invention, FIG. 2 is a plan view illustrating an outline of the first embodiment of the optical waveguide structure of the present invention, FIG. 3 is a plan view illustrating a core layer of the optical waveguide structure illustrated in FIG. 1 and FIG. 2, and FIG. 4 is a cross-sectional view of the core layer illustrated in FIG. 3 along the line A-A. In the following description, the upper side in FIG. 1 and FIG. 4 is referred to as "upper", and the lower side is described as "lower".

The optical waveguide structure 1 is composed mainly of an optical waveguide substrate 2, wiring boards 3a and 3b bonded to the upper surface of this optical waveguide substrate 2, as well as a light emitting element 4 and a light emitting element IC 40, and a light receiving element 5 and a light receiving element IC 50 installed on top of the wiring boards 3a and 3b respectively.

Light L from the light emitting element 4 is transmitted through the inside of the optical waveguide substrate (optical circuit) 2, and is received by the light receiving element 5. In other words, optical communication occurs between the light emitting element 4 and the light receiving element 5 via the optical waveguide substrate 2.

The optical waveguide substrate 2 includes an optical waveguide 20 and protective layers 29 provided on the upper and lower surfaces of this optical waveguide 20.

The optical waveguide 20 has a core layer 21 formed in a layered shape, and layered cladding layers 22 that are provided on the upper and lower surfaces of this core layer 21, wherein the light L that is input into one end of the core layer 21 is transmitted (transported) to the other end. Details regarding this optical waveguide 20 are described below.

Furthermore, in the present embodiment, the optical waveguide substrate 2 is provided with notched sections 28a and 28b, which are formed by removing a portion from the lower surface of the optical waveguide substrate 2 that extends beyond the core layer 21 (core portions 211) and reaches the upper protective layer 29. At least the surfaces of the core layer 21 facing the notched sections 28a and 28b are formed as mirrors (optical path modification sections that modify the optical path of the light) 23a and 23b respectively which reflect the light based on the difference in refractive index between the core layer 21 and the air inside the notched sections 28a and 28b.

By employing this structure, those regions of the core portions 211 where the mirrors 23a and 23b are formed become the end sections of the core portions 211.

Further, the notched sections 28a and 28b are formed so as to have a right-angled triangular shape in a longitudinal cross-section of the optical waveguide substrate 2, and the mirrors 23a and 23b are inclined approximately 45° relative to the central axis of the core layer 21. Accordingly, as illustrated by the arrows in FIG. 1, the light L emitted in the downward direction from the light emitting element 4 undergoes a modification (bending) of the optical path of approximately 90° by reflection off the mirror 23a positioned immediately below the light emitting element 4, is then transmitted through the inside of the core layer 21 (core portions 211), subsequently undergoes a modification of the optical path of approximately 90° by reflection upward off the mirror 23b positioned immediately below the light receiving element 5, and then enters the light receiving element 5.

By providing these types of mirrors 23a and 23b, the main surfaces (the upper surface and/or lower surface) of the optical waveguide substrate 2 can be used as the regions for installing the light emitting element 4 and the light receiving element 5, which enables the size of the optical waveguide structure 1 to be reduced, and contributes toward higher density packaging.

The protective layers 29 have the function of protecting the upper and lower surfaces of the optical waveguide 20.

Although there are no particular limitations on the average thickness of the protective layers 29, a thickness of approximately 5 to 200 µm is preferable, and approximately 10 to 100 µm is more preferable. This enables the protective layers 29 to adequately perform the function of protecting the optical waveguide 20. Further, in those cases where the entire optical waveguide substrate 2 is to be imparted with flexibility, the above thickness prevents any deterioration in that flexibility.

There are no particular limitations on the construction material for the protective layers 29, and examples include polyimides, polyimide amides, polyimide amide ethers, polyester imides, and polyimide ethers.

The wiring boards 3a and 3b are bonded to the upper surface of this type of optical waveguide substrate 2, and the light emitting element 4 and the light emitting element IC 40, and the light receiving element 5 and the light receiving element IC 50 respectively are installed on the upper surfaces of the wiring boards 3a and 3b respectively, so as to correspond with the core portions 211 of the core layer 21 described below.

The wiring boards 3a and 3b each have a wiring portion (conductive portion) 30 formed in a prescribed pattern.

Furthermore, the light emitting element (optical element) 4 includes an element main body 41 having a light emitting section, and bumps 42. The bumps 42 are bonded to terminals on the wiring portion 30. Further, the light emitting element IC 40 includes an element main body 401 having a prescribed circuit formed thereon, and bumps 402. The bumps 402 are bonded to terminals on the wiring portion 30. As a result, the light emitting element 4 is connected electrically to the light emitting element IC 40 via the wiring boards 3a and 3b, and the operation of the light emitting element 4 is controlled by the light emitting element IC 40.

Moreover, the light receiving element (optical element) 5 includes an element main body 51 having a light receiving section, and bumps 52. The bumps 52 are bonded to terminals on the wiring portion 30. Further, the light receiving element IC 50 includes an element main body 501 having a prescribed circuit formed thereon, and bumps 502. The bumps 502 are bonded to terminals on the wiring portion 30. As a result, the light receiving element 5 is connected electrically to the light receiving element IC 50 via the wiring boards 3a and 3b, and the light receiving element IC 50 is operated so as to amplify the signals detected by the light receiving element 5.

Accordingly, an electrical circuit is constructed inside the optical waveguide structure 1, and within the optical waveguide structure 1, by operating these optical elements (the light emitting element 4 and the light receiving element 5) and electrical elements (the light emitting element IC 40 and the light receiving element IC 50) in cooperation, inter-conversion between optical signals and electrical signals can be performed reliably, enabling high-speed and low-noise signal processing to be performed easily.

In theses types of wiring boards 3a and 3b, the portion that corresponds with the optical path of the light L from the light emitting element 4, and the portion that corresponds with the optical path of the light L entering the light receiving element 5 are each formed from a member that has optical transparency, so as to permit transmission of the light L.

As described above, the optical waveguide 20 has the core layer 21 formed in a layered shape, and the layered cladding layers 22 that are provided on the upper and lower surfaces of this core layer 21.

As illustrated in FIG. 3, the core layer 21 includes the core portions 211, composed of a plurality of elongated prescribed patterns (four in the present embodiment) that are set along the lengthwise direction of the belt-shaped (layered) optical waveguide 20, and a cladding portion 212 that is provided so as to surround these core portions 211.

In other words, the cladding portion 212 is provided between adjacent core portions 211 so as to contact both core portions.

The cladding portion 212 is a portion that has the same function as the cladding layers 22, and compared with the core portions 211, the cladding portion 212 and the cladding layers 22 have a lower average refractive index (hereafter also referred to as simply the "refractive index").

Accordingly, each core portion 211, which is formed surrounded by the cladding portion 212 and the cladding layers 22, forms an optical path through which the light L entering from the notched section 28a is transmitted (transported) to the notched section 28b while reflecting off the interface between the core portion 211 and the cladding portion 212 and the interface between the core portion 211 and the cladding layers 22.

The refractive index of the core portions 211 is preferably from 1.400 to 1.700, and more preferably from 1.425 to 1.675. The refractive index of the cladding portion 212 and the cladding layers 22 is preferably from 1.350 to 1.600, and more preferably from 1.375 to 1.575.

The difference in the refractive index between the core portion 211 and the cladding portion 212 and the difference in the refractive index between the core portion 211 and the cladding layers 22 are preferably at least 0.5%, and more preferably 0.8% or greater. On the other hand, although no particular limitations need be set on the upper limit for this difference, the upper limit is preferably approximately 5.5%. If the difference in the refractive index is less than the lower limit mentioned above, then the light transmission effect may deteriorate, whereas even if the difference exceeds the upper limit mentioned above, no further increase in the light transmission efficiency can be expected.

The aforementioned difference in the refractive index is represented by the following formula, wherein the refractive index of the core portions 211 is termed A, and the refractive index of the cladding portion 212 and the cladding layers 22 is termed B.

Difference in refractive index (%)=$|A/B-1|\times 100$

There are no particular limitations on the construction materials for the core layer 21 and the cladding layers 22, provided the material yields the difference in refractive index described above, and specific examples of materials that can be used include various resin materials such as acrylic resins, methacrylic resins, polycarbonates, polystyrenes, epoxy resins, polyamides, polyimides, polybenzoxazoles, polysilanes, polysilazanes, and cyclic olefin resins such as benzocyclobutene resins and norbornene resins, as well as glass materials such as quartz glass, and borosilicate glass and the like.

In the present invention, the plurality of core portions 211 which transmit the light L are structured so that adjacent core portions are arranged with substantially parallel central axes, and the optical paths of the light L that is transmitted through the adjacent core portions are in opposite directions. By employing this configuration, even if a leaked signal from an adjacent core portion 211 enters a core portion 211 and generates crosstalk, any noise in the signal caused by this crosstalk can be accurately suppressed or prevented. It is thought that the reason for this effect is that because the optical path of the leaked signal that causes the crosstalk is in the opposite direction, this leaked signal travels through the entered core portion 211 and reaches the light emitting element 4 side.

Moreover, in the present invention, each core portion 211 has a tapered section in which the area of the cross-section in a direction substantially perpendicular to the central axis decreases gradually in the direction of the optical path of the light L. In the present invention, the expression "a direction substantially perpendicular" means a direction at an angle of 90°±2° relative to the central axis, and preferably a direction at an angle of 90°±1°.

As illustrated in FIG. 3, in the present embodiment, almost the entire length of each core portion 211 is composed of a tapered section, and the width of the core portion 211 in plan view narrows gradually from the side of the notched section 28a toward the side of the notched section 28b, namely in the direction of the optical path of the light L. As a result, as illustrated in FIG. 4, a tapered section is formed in which the area of the cross-section in a direction substantially perpendicular to the central axis decreases gradually.

In the present embodiment, as illustrated in FIG. 3, the core portions 211 preferably do not have an expansion section in which the cross-sectional area in a direction substantially perpendicular to the central axis increases gradually in the direction of the optical path. By employing a structure that does not have an expansion section, the loss variation corresponding with the cross-sectional area ratio between the inlet and outlet can be minimized.

In the tapered section of the present invention, the area of the cross-section in a direction substantially perpendicular to the central axis decreases such that the ratio of the cross-sectional area at the tapered outlet relative to the cross-sectional area at the optical path inlet is preferably from 0.3 to 0.001%, and more preferably from 0.05 to 0.005%. Although there are no particular limitations on the shape of the cross-section, a rectangle, square, ellipse or circle is preferable, an ellipse or circle is more preferable, and a circle is particularly desirable.

In this manner, even though the core portions 211 are formed with a tapered section, as mentioned above, the optical paths of the light L within adjacent core portions 211 are in opposite directions. As a result, in the region where the cross-sectional area of a single core portion 211 is decreasing gradually, the cross-sectional area of the corresponding region of the adjacent core portion 211 is increasing gradually. Accordingly, the separation distance between adjacent core portions 211 can be maintained at a substantially constant value along the entire length of the core portions, meaning the occurrence of crosstalk between these core portions can be accurately suppressed or prevented.

The separation distance between adjacent core portions 211 is preferably from 5 to 250 μm, and more preferably from 10 to 100 μm.

Further, by employing a configuration such as the present invention in which each core portion 211 has a tapered section, because the areas of the cross-sections at the two end sections differ, the formation region for the notched section 28b can be set to smaller size than the formation region for the notched section 28a, as illustrated in FIG. 2 and FIG. 3. As a result, adjacent core portions 211 can be positioned close together while preventing the formation region for the notched section 28a of one core portion 211 overlapping with the formation region for the notched section 28b of the adjacent core portion, and therefore miniaturization and higher integration of the optical waveguide 20 can be achieved.

Moreover, in the core portions 211, the area of the cross-section at the source end section in the direction of the optical path of the light L is larger than the area of the cross-section at the destination end section in the direction of the optical path of the light L. As a result, the light emitted from the light emitting element 4 can be received more efficiently. Particularly in those cases where a semiconductor laser is used as the light emitting element 4, because the light is irradiated with a prescribed divergence angle, ensuring a large area for the cross-section at the source end section in the direction of the optical path of the light L is effective from the viewpoint of enhancing the optical coupling efficiency between the light emitting element 4 and the core portion 211. In addition, because the area for the cross-section at the source end section in the direction of the optical path of the light L is large, even if the position of light emission is slightly misaligned relative to the cross section at the source end section in the direction of the optical path of the light L (namely, the notched section 28a), any significant deterioration in the optical coupling efficiency between the light emitting element 4 and the core portion 211 can be suppressed. Accordingly, the positioning tolerances when mounting the light emitting element 4 can be increased, which facilitates the mounting process.

In contrast, in the core portions 211, the area of the cross-section at the destination end section in the direction of the optical path of the light L is smaller than the area of the cross-section at the source end section in the direction of the optical path of the light L. As a result, the light output from the destination end section in the direction of the optical path of the light L can be received more efficiently by the light receiving section of the light receiving element 5. In addition, because the area of the cross-section at the destination end section in the direction of the optical path of the light L is small, even if the position of light reception is slightly misaligned relative to the cross section at the destination end section in the direction of the optical path of the light L (namely, the notched section 28b), any significant deterioration in the optical coupling efficiency between the light receiving element 5 and the core portion 211 can be suppressed. Accordingly, the positioning tolerances when mounting the light receiving element 5 can be increased, which facilitates the mounting process.

Specifically, in the present embodiment, as illustrated in FIG. 3, the width in plan view of each core portion 211 at the source end section in the direction of the optical path of the light L is preferably from approximately 40 to 100 μm, and more preferably from approximately 50 to 80 μm. Further, the width of the destination end section in the direction of the optical path of the light L is preferably from approximately 10 to 40 μm, and more preferably from approximately 15 to 30 μm. This enables the effects described above to be achieved more prominently.

Moreover, in the present embodiment, the end sections of adjacent core portions 211 are mutually offset in the direction of the optical path of the light L. As a result, the formation region for the notched section 28a and the formation region for the notched section 28b, which are formed at the end sections of adjacent core portions 211, are mutually offset. At this time, the formation region for the notched section 28a and the formation region for the notched section 28b are preferably offset in a staggered arrangement. This point also enables miniaturization and higher integration of the optical waveguide 20 to be achieved.

The lengths of the core portions 211 illustrated in FIG. 3 may be all substantially the same, or may be different.

The type of optical waveguide structure 1 described above can be produced, for example, in the manner described below.

The following description describes an example in which the core layer 21 of the optical waveguide substrate 2 is formed using a photosensitive resin composition 70 for which the refractive index decreases under the action of a photosensitizing light.

Figure 5:
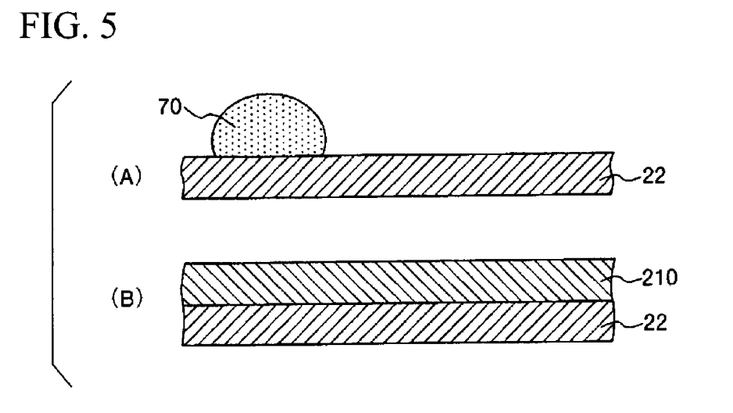
FIG. 5 is a partial longitudinal sectional view for explaining the production process for an optical waveguide substrate of the optical waveguide structure.
Figure 6:
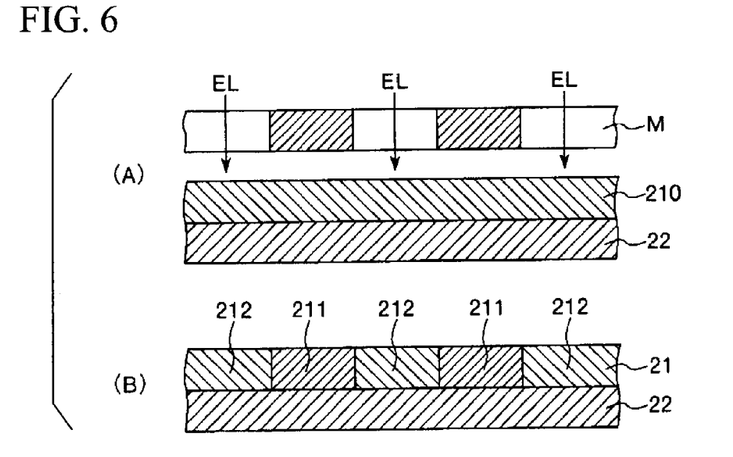
FIG. 6 is a partial longitudinal sectional view for explaining the production process for the optical waveguide substrate of the optical waveguide structure.
Figure 7:
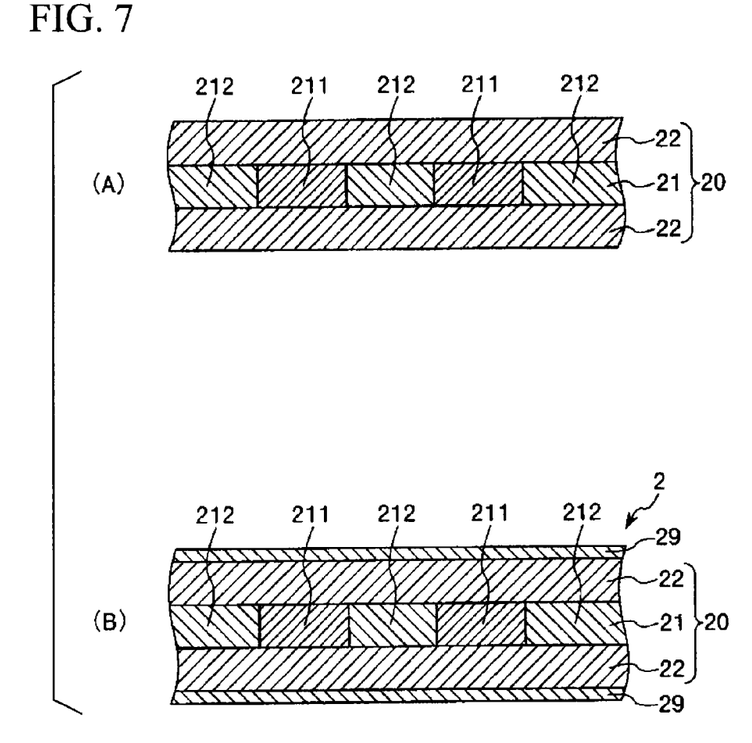
FIG. 7 is a partial longitudinal sectional view for explaining the production process for the optical waveguide substrate of the optical waveguide structure.

FIG. 5 to FIG. 7 are partial longitudinal sectional views for explaining the production process for an optical waveguide substrate of the optical waveguide structure.

<1> First, the optical waveguide substrate 2 is formed.

<1-1> First, the photosensitive resin composition 70 for which the refractive index changes and decreases under the action of a photosensitizing light EL (activating radiation) is prepared.

For example, a resin composition having a special blend can be used as the photosensitive resin composition 70.

This resin composition contains a base polymer and a monomer that has a lower refractive index than this base polymer, and by causing a reaction of the monomer to proceed in an irradiated region that has been irradiated with the photosensitizing light EL, unreacted monomer diffuses from a non-irradiated region that has not been irradiated with the photosensitizing light EL into the irradiated region, and as a result, the refractive index of the non-irradiated region becomes higher than the refractive index of the irradiated region.

Examples of the base polymer include cyclic olefin resins such as norbornene resins and benzocyclobutene resins, acrylic resins, methacrylic resins, polycarbonates, polystyrenes, epoxy resins, polyamides, polyimides, polybenzoxazoles, silicone resins and fluororesins. Any one of these resins or a combination of two or more of the resins (such as a polymer alloy, a polymer blend (mixture) or a copolymer) may be used.

Among these possibilities, a base polymer containing mainly a cyclic olefin resin is preferable. By using a cyclic olefin resin as the base polymer, core portions 211 having excellent optical transmission performance and heat resistance can be formed.

Moreover, from the viewpoints of the heat resistance and the transparency and the like, the use of a norbornene resin as the cyclic olefin resin is preferable. Further, because norbornene resins have high hydrophobicity, core portions 211 can be formed that are resistant to dimensional changes and the like caused by water absorption.

On the other hand, a monomer having a lower refractive index than the base polymer is selected as the monomer from among norbornene monomers, acrylic acid (and methacrylic acid) monomers, epoxy monomers, oxetane monomers, vinyl ether monomers and styrene monomers and the like, and any one such monomer or a combination of two or more such monomers may be used.

Among these possibilities, the use of a monomer or oligomer having a cyclic ether group such as an oxetanyl group or epoxy group is preferable. By using a monomer or oligomer having a cyclic ether group, because ring-opening of the cyclic ether group occurs readily, a monomer that can react rapidly is obtained.

Specifically, examples of monomers containing an oxetanyl group and having a lower refractive index than the base polymer include the monofunctional oxetane represented by the following formula (1) (3-(cyclohexyloxy)methyl-3-ethyloxetane; CHOX).

[Chemical Formula 1]

(1)

<1-2> Next, the photosensitive resin composition 70 is supplied, if necessary in varnish form, onto a preformed cladding layer 22, as illustrated in FIG. 5(A), thus forming a liquid coating.

In those cases where the photosensitive resin composition 70 is converted to a varnish form, the varnish can be obtained by dissolving or dispersing the photosensitive resin composition 70 in a solvent or dispersion medium. Examples of this solvent or dispersion medium include various organic solvents, including ether-based solvents such as diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme) and diethylene glycol ethyl ether (carbitol), cellosolve-based solvents such as methyl cellosolve, ethyl cellosolve, and phenyl cellosolve, aliphatic hydrocarbon solvents such as hexane, pentane, heptane and cyclohexane, aromatic hydrocarbon solvents such as toluene, xylene, benzene and mesitylene, heteroaromatic compound solvents such as pyridine, pyrazine, furan, pyrrole, thiophene and methylpyrrolidone, amide-based solvents such as N,N-dimethylformamide (DMF) and N,N-dimethylacetamide (DMA), halogenated compound solvents such as dichloromethane, chloroform and 1,2-dichloroethane, ester-based solvents such as ethyl acetate, methyl acetate and ethyl formate, and sulfur compound solvents such as dimethylsulfoxide (DMSO) and sulfolane, as well as mixed solvents containing these solvents.

Any of various coating methods can be used as the method of supplying the photosensitive resin composition 70 onto the cladding layer 22, and examples of the method include doctor blade methods, spin coating methods, dipping methods, table coating methods, spraying methods, applicator methods, curtain coating methods and die coating methods.

A sheet material described below, having a lower refractive index than the core portions 211, is used as the cladding layer 22. There are no particular limitations on this sheet material, and for example, a sheet material containing a norbornene resin and an epoxy resin may be used.

<1-3> Next, the liquid coating formed on top of the cladding layer 22 is dried to form a film 210 for forming an optical waveguide, as illustrated in FIG. 5(B).

This film 210 becomes the core layer 21 containing the core portions 211 and the cladding portion 212 upon irradiation with the photosensitizing light (activating radiation) EL described below.

<1-4> Next, the region of the film 210 in which the cladding portion 212 is to be formed is irradiated selectively with photosensitizing light EL (such as ultraviolet light).

During this process, as illustrated in FIG. 6(A), a mask M having openings corresponding with the shape of the cladding portion 212 that is to be formed is positioned above the film 210. The film 210 is irradiated with the photosensitizing light EL through this mask M.

An example of the photosensitizing light EL that is used is light having a peak wavelength within the wavelength range from 200 to 450 nm. This enables the refractive index in the region of the film 210 irradiated with the photosensitizing light EL to be reduced comparatively easily.

Further, although there are no particular limitations on the irradiation dose of the photosensitizing light EL, a dose of approximately 0.1 to 9 J/cm$^2$ is preferable, approximately 0.2 to 6 J/cm$^2$ is more preferable, and approximately 0.2 to 3 J/cm$^2$ is still more preferable.

When a photosensitizing light EL having superior directivity such as a laser light is used, use of the mask M may be able to be omitted.

In the irradiated region of the film 210 that has been irradiated with the photosensitizing light EL, reaction of the monomer (such as crosslinking of the base polymer or monomer polymerization or the like) starts. Further, in the non-irradiated region that has not been irradiated with the photosensitizing light EL, no monomer reaction occurs.

As a result, in the irradiated region, reaction of the monomer proceeds, and the amount of residual monomer decreases. As this occurs, the monomer in the non-irradiated region diffuses into the irradiated region, causing a difference in refractive index to develop between the irradiated region and the non-irradiated region.

In the present embodiment, the refractive index of the monomer is lower than the refractive index of the base polymer, and therefore the diffusion of the monomer from the non-irradiated region into the irradiated region causes the refractive index of the irradiated region to progressively decrease, while the refractive index of the non-irradiated region progressively increases.

Upon completion of this step, as illustrated in FIG. 6(B), the core layer 21 is formed in which the non-irradiated region and the irradiated region of the film 210 have become the core portions 211 and the cladding portion 212 respectively.

As illustrated in FIG. 3, when the separation distance between the adjacent core portions 211 that are to be formed is substantially constant along the entire length of the core portions, using the aforementioned method in which monomer diffusion is used to form these core portions 211 and the cladding portion 212 enables the amount of the monomer that diffuses into the irradiated region to be more uniform across each portion of the irradiated region. As a result, the difference in refractive index between the formed core portions 211 and the cladding portion 212 is substantially constant for all portions of the core portions 211 and the cladding portion 212.

<1-5> Next, another cladding layer 22 is formed on top of the core layer 21, by affixing a film similar to that used for forming the cladding layer 22 on the lower surface of the core layer 21.

Accordingly, the pair of cladding layers 22 are positioned so as to sandwich the core portions 211 from a different direction from the cladding portion 212, namely from the upper and lower directions of the core portions 211, and as a result, an optical waveguide 20 such as that illustrated in FIG. 7(A) is formed.

The upper cladding layer 22 may also be formed by a method in which, rather than affixing a film-like layer, a liquid material is applied to the top of the core layer 21 and then cured (solidified).

<1-6> Next, a protective layer 29 is formed on each of the two cladding layers 22.

Formation of these protective layers 29 may employ the same methods as those described above, within the description of step <1-5>, for forming the cladding layers 22.

By performing the types of steps described above, the type of optical waveguide substrate 2 illustrated in FIG. 7(B) is produced.

<2> Subsequently, laser processing or grinding or the like is used to form the notched sections 28a and 28b in prescribed positions on the optical waveguide substrate 2.

<3> Next, the wiring boards 3a and 3b are prepared.

The wiring boards 3a and 3b are each produced by preparing a laminate (such as a double-sided copper-clad laminate) having metal layers formed on both surfaces of a flat plate-like base, and then performing etching or laser processing to pattern the metal layers into prescribed shapes, thereby forming the wiring portions.

<4> Next, the light emitting element 4 and the light emitting element IC 40, and the light receiving element 5 and the light receiving element IC 50 are prepared, and these are then installed (bonded) at prescribed positions on the wiring boards 3a and 3b respectively.

Subsequently, the wiring boards 3a and 3b are positioned so that the light emitting section of the light emitting element 4 corresponds with the mirror 23a of the notched section 28a, and the light receiving section of the light receiving element 5 corresponds with the mirror 23b of the notched section 28b, and the wiring boards 3a and 3b are then bonded to the upper surface of the optical waveguide substrate 2 using an adhesive.

By performing the types of steps described above, the optical waveguide structure 1 is produced.

In the present embodiment, a description was provided for the case in which a resin composition containing a monomer with a lower refractive index than the base polymer was used for forming the core layer 21 having the core portions 211 and the cladding portion 212, but the present invention is not limited to this particular case, and a resin composition containing a monomer with a higher refractive index than the base polymer may also be used to form the core layer 21.

When this type of resin composition is used, the irradiated region of the film 210 into which the monomer diffuses upon irradiation with the photosensitizing light EL develops a higher refractive index than the non-irradiated region of the film 210. Accordingly, in this embodiment, a core layer 21 is formed in which the irradiated region and the non-irradiated region of the film 210 become the core portions 211 and the cladding portion 212 respectively.

<Second Embodiment>

Next is a description of a second embodiment of the optical waveguide structure of the present invention.

Figure 8:
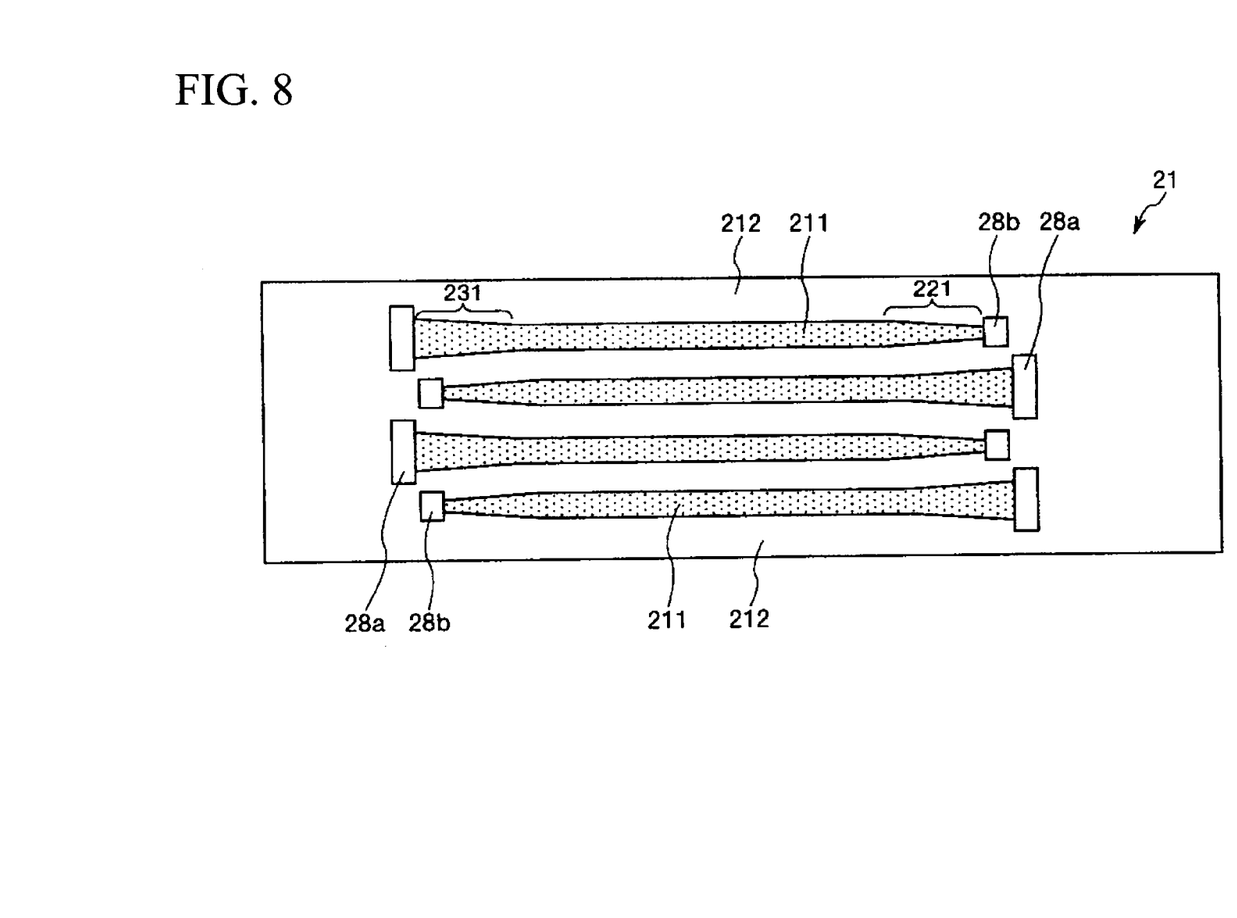
FIG. 8 is a plan view illustrating a core layer of a second embodiment of the optical waveguide structure of the present invention.

FIG. 8 is a plan view illustrating the core layer of the second embodiment of the optical waveguide structure of the present invention.

The optical waveguide structure of the second embodiment is described below, focusing on the points of difference from the optical waveguide structure of the first embodiment. No description is provided for those items which are the same as the first embodiment.

The optical waveguide structure 1 of the second embodiment is the same as the optical waveguide structure 1 of the first embodiment, with the exception that the structure of the core portions 211 of the optical waveguide substrate 2 differs.

In other words, as illustrated in FIG. 8, in the present embodiment, the entire length of each core portion 211 is not composed of a tapered section, but rather tapered sections are formed selectively at both ends of the core portion 211.

More specifically, at the source end section in the direction of the optical path of the light L, a tapered section 231 in which the area of the cross-section decreases gradually in the direction of the optical path is formed, and another tapered section 221 in which the area of the cross-section decreases gradually in the direction of the optical path is formed at the destination end section in the direction of the optical path of the light L. In the region between these tapered sections 231 and 221, an equal area section is formed in which the area of the cross-section remains constant.

In the core portions 211 having tapered sections with the structures described above, similar actions and effects to those of the first embodiment can be obtained.

In the present embodiment, the core portions 211 need not necessarily include both tapered sections 231 and 221, and may contain only one of the tapered sections 231 and 221.

The optical waveguide structure of the present invention can also be used in any electronic device that performs signal processing of both optical signals and electrical signals, and for example, can be used favorably in electronic devices such as router devices, WDM devices, portable telephones, gaming machines, personal computers, televisions and home servers. In any of these types of electronic devices, large volumes of data must be transmitted at high speed between an arithmetic unit such as an LSI or the like and a memory unit such as RAM or the like. Accordingly, by equipping these types of electronic devices with the optical waveguide structure of the present invention, problems such as noise and signal degradation which are typical of electrical wiring can be resolved, and a dramatic improvement in performance can be expected.

Moreover, in the optical waveguide portion, heat generation is significantly reduced compared with electrical wiring. As a result, the degree of integration on the substrate can be increased and the amount of electrical power required for cooling can be reduced, enabling a reduction in the power consumption of the entire electronic device.

Embodiments of the optical waveguide structure and the electronic device of the present invention have been described above, but the present invention is in no way limited by these embodiments.

For example, each of the portions that constitutes the optical waveguide structure may be substituted with an arbitrary component that is able to generate the same functions. Further, additional arbitrary components may also be added.

Furthermore, in the optical waveguide structure of the present invention, arbitrary structures of the first and second embodiments may be combined.

Moreover, in each of the above embodiments, a case was described in which the longitudinal sectional shape of the core portions was rectangular, but the present invention is not limited to this case. The longitudinal sectional shape of the core portions may also be elliptical, oval or triangular or the like.

INDUSTRIAL APPLICABILITY

According to the present invention, the occurrence of crosstalk between adjacent core portions can be suppressed. As a result, a highly reliable optical waveguide structure and electronic device can be obtained.

Moreover, miniaturization and increased integration of the optical waveguide can be achieved while maintaining suppression of the occurrence of crosstalk between adjacent core portions.

DESCRIPTION OF THE REFERENCE SIGNS

1: Optical waveguide structure
2: Optical waveguide substrate
20: Optical waveguide
21: Core layer
210: Film
211: Core portion
212: Cladding portion
22: Cladding layer
221, 231: Tapered section
23a, 23b: Mirror
28a, 28b: Notched section
29: Protective layer
3a, 3b: Wiring board
30: Wiring portion
4: Light emitting element
41: Element main body
42: Bump
40: Light emitting element IC
401: Element main body
402: Bump
5: Light receiving element
51: Element main body
52: Bump
50: Light receiving element IC
501: Element main body
502: Bump
70: Photosensitive resin composition
M: Mask
L: Light
EL: Photosensitizing light

The invention claimed is:

1. An optical waveguide structure, comprising:
an optical waveguide substrate comprising a plurality of core portions such that the plurality of core portions has substantially parallel central axes extending in directions of optical paths of light transmitted through the core portions,
wherein the plurality of core portions has adjacent core portions having the directions of optical paths in opposite directions, and each of the core portions has a tapered section tapering along a respective one of the central axes in a direction of light transmission such that the adjacent core portions have tapered sections tapering in the opposite directions and that the central axes extend through the tapered sections, respectively.

2. The optical waveguide structure according to claim 1, wherein the adjacent core portions have end sections mutually offset in the directions of optical paths at least at one end of the adjacent core portions.

3. The optical waveguide structure according to claim 2, wherein the adjacent core portions have end sections mutually offset in a staggered arrangement in the directions of optical paths at least at one end of the adjacent core portions.

4. The optical waveguide structure according to claim 1, wherein each of the core portions does not have an expansion section expanding in the direction of light transmission.

5. The optical waveguide structure according to claim 1, wherein the tapered section of each of the core portions is formed along substantially an entire length of each of the core portions.

6. The optical waveguide structure according to claim 1, wherein the tapered section of each of the core portions is formed within at least one end section of each of the core portions.

7. The optical waveguide structure according to claim 1, wherein each of the core portions has an optical path modification section that modifies the direction of light transmission at least at one end section of each of the core portions.

8. The optical waveguide structure according to claim 7, further comprising:
a plurality of optical elements each having a light emitting section or a light receiving section,
wherein each of the optical elements is positioned to correspond with the optical path modification section of each of the core portions.

9. The optical waveguide structure according to claim 1, wherein each of the core portions has a width in a range of from 40 µm to 100 µm in plan view at an end section on a source side in the direction of light transmission.

10. The optical waveguide structure according to claim 1, wherein each of the core portions has a width in a range of from 10 µm to 40 µm in plan view at an end section on a destination side in the direction of light transmission.

11. The optical waveguide structure according to claim 1, wherein the optical waveguide substrate has a cladding portion having a lower average refractive index than an average refractive index of the core portions such that the cladding portion is formed between the adjacent core portions in contact with the adjacent core portions.

12. The optical waveguide structure according to claim 11, wherein the core portions and the cladding portion are formed by:
irradiating with activating radiation a layer comprising a polymer and a monomer having a different refractive index from the polymer such that a reaction of the monomer proceeds in an irradiated region irradiated with the activating radiation, that unreacted monomer diffuses from a non-irradiated region not irradiated with the activating radiation into the irradiated region, and that a difference in refractive index between the irradiated region and the non-irradiated region is generated, wherein one of the irradiated region and the non-irradiated region forms the core portions, and the other one of the irradiated region and the non-irradiated region forms the cladding portion.

13. The optical waveguide structure according to claim 1, wherein the adjacent core portions have a separation distance between the adjacent core portions which is substantially constant along an entire length of the core portions.

14. An electronic device, comprising the optical waveguide structure of claim 1.

15. The optical waveguide structure according to claim 1, wherein the optical waveguide substrate is made of a photosensitive resin composition.

16. The optical waveguide structure according to claim 1, wherein the optical waveguide substrate is made of a photosensitive resin composition comprising a base polymer and an unreacted monomer.

17. The optical waveguide structure according to claim 1, wherein the optical waveguide substrate comprises a plurality of cladding layers and a core layer interposed between the cladding layers, and the plurality of core portions is formed in the core layer.

18. The optical waveguide structure according to claim 1, wherein the optical waveguide substrate comprises a plurality of protective layers, a plurality of cladding layers interposed between the protective layers, and a core layer interposed between the cladding layers, and the plurality of core portions is formed in the core layer.

19. The optical waveguide structure according to claim 1, wherein the optical waveguide substrate has a cladding portion having a lower average refractive index than an average refractive index of the core portions such that the cladding portion is formed between the adjacent core portions in contact with the adjacent core portions, the optical waveguide substrate is made of a photosensitive resin composition, the plurality of core portions has a refractive index in a range of from 1.425 to 1.675, and the cladding portion has a refractive index in a range of from 1.350 to 1.600.

20. The optical waveguide structure according to claim 1, wherein the optical waveguide substrate has a cladding portion having a lower average refractive index than an average refractive index of the core portions such that the cladding portion is formed between the adjacent core portions in contact with the adjacent core portions, the optical waveguide substrate is made of a photosensitive resin composition, and the plurality of core portions and the cladding portion are formed such that a difference in refractive index between the plurality of core portions and the cladding portion is at least 0.5%.

* * * * *